US012795872B2

(12) United States Patent
Schroeder

(10) Patent No.: US 12,795,872 B2
(45) Date of Patent: Nov. 10, 2026

(54) HEATSINK ARRANGEMENT FOR A POWER CONVERTER

(71) Applicant: Danfoss Power Electronics A/S, Gråsten (DK)

(72) Inventor: Stefan Schroeder, Ismaning (DE)

(73) Assignee: DANFOSS POWER ELECTRONICS A/S, Gråsten (DK)

( * ) Notice: Subject to any disclaimer, the term of this patent is extended or adjusted under 35 U.S.C. 154(b) by 110 days.

(21) Appl. No.: 17/543,859

(22) Filed: Dec. 7, 2021

(65) Prior Publication Data

US 2022/0192049 A1 Jun. 16, 2022

(30) Foreign Application Priority Data

Dec. 15, 2020 (DE) ......................... 102020133622.5

(51) Int. Cl.

*H05K 7/20* (2006.01)
*H05K 9/00* (2006.01)
*H02P 29/024* (2016.01)

(52) U.S. Cl.

CPC ........... *H05K 7/209* (2013.01); *H05K 9/0064* (2013.01); *H02P 29/0241* (2016.02)

(58) Field of Classification Search

None
See application file for complete search history.

(56) References Cited

U.S. PATENT DOCUMENTS 5,309,324 A * 5/1994 Herandez ............. H05K 1/0206 361/811
6,891,247 B2 * 5/2005 Kikuchi ................ H01L 23/642 257/E23.079
7,129,714 B2 * 10/2006 Baxter ..................... G01D 5/24 324/686
7,505,274 B2 * 3/2009 Yu ....................... H01L 23/4006 257/718
8,558,481 B2 * 10/2013 Kim ....................... H05B 45/44 315/307
10,924,011 B2 * 2/2021 Parto ......................... G05F 1/46
11,108,336 B1 * 8/2021 Rosado .............. H05K 7/14329
2009/0016088 A1 * 1/2009 Bayerer .................. H01L 24/40 257/E23.101

(Continued)

FOREIGN PATENT DOCUMENTS

DE 102008061488 A1 6/2010
DE 102012005622 A1 9/2013

(Continued)

OTHER PUBLICATIONS

Chinese Office Action and its English translation for corresponding Chinese Patent Application No. 202111513922.9 dated May 28, 2025 (10 pp.).

*Primary Examiner* — Courtney L Smith
(74) *Attorney, Agent, or Firm* — McCormick, Paulding & Huber PLLC

(57) ABSTRACT

The present invention pertains to a heatsink arrangement for a power converter, wherein the heatsink is grounded via a grounding capacitor. The invention also pertains to a power converter for driving an electric motor, including a corresponding heatsink, semiconductor switches mounted on the heatsink and a fluid cooling system.

17 Claims, 4 Drawing Sheets

(56) References Cited

U.S. PATENT DOCUMENTS

| | | | | |
|---|---|---|---|---|
| 2009/0109713 | A1* | 4/2009 | Schnetzka | H02M 5/4585 361/699 |
| 2010/0328901 | A1* | 12/2010 | Minato | H01L 23/49541 361/730 |
| 2012/0068681 | A1* | 3/2012 | Ejury | H01L 25/16 29/25.01 |
| 2014/0003106 | A1 | 1/2014 | Shirakawa et al. | |
| 2014/0312622 | A1* | 10/2014 | Gupta | H02J 3/381 290/44 |
| 2018/0156846 | A1* | 6/2018 | Kshirsagar | G01R 15/165 |
| 2018/0218963 | A1* | 8/2018 | Hojo | H01L 23/3677 |
| 2020/0083177 | A1* | 3/2020 | Lamorey | H01L 25/0655 |
| 2020/0404804 | A1* | 12/2020 | Stoltz | H05K 7/20254 |
| 2021/0044179 | A1* | 2/2021 | Kitagawa | H02K 1/146 |
| 2021/0168965 | A1* | 6/2021 | Shi | H05K 7/14329 |
| 2021/0225753 | A1* | 7/2021 | Hong | H05K 1/0204 |
| 2021/0391236 | A1* | 12/2021 | Tsuyuno | H01L 23/3735 |
| 2022/0311354 | A1* | 9/2022 | Gerçek | H02J 3/381 |
| 2023/0223751 | A1* | 7/2023 | Holcombe | H02M 1/322 307/18 |

FOREIGN PATENT DOCUMENTS

| | | | |
|---|---|---|---|
| DE | 112018003391 | T5 | 3/2020 |
| DE | 202020100386 | U1 | 3/2020 |
| EP | 3745577 | A1 | 12/2020 |
| JP | 2006025467 | A | 1/2006 |
| JP | 2014007931 | A | 1/2014 |

* cited by examiner

Figure 1 - State of the Art

Figure 2 - State of the Art

HEATSINK ARRANGEMENT FOR A POWER CONVERTER

CROSS-REFERENCE TO RELATED APPLICATION

This application claims foreign priority benefits under 35 U.S.C. § 119 to German Patent Application No. 102020133622.5 filed on Dec. 15, 2020, the content of which is hereby incorporated by reference in its entirety.

TECHNICAL FIELD

The present invention pertains to a heatsink arrangement for a power electronic converter, in particular converters used in medium voltage power conversion such as a medium voltage drive for driving an electric motor, wherein the heatsink of the heatsink arrangement is grounded via a grounding capacitor. The invention also pertains to a power converter for driving an electric motor, comprising a corresponding heatsink arrangement, semiconductor switches mounted on the heatsink and a fluid cooling system.

BACKGROUND

From prior art various medium voltage drives and corresponding heatsinks are known. According to some designs, the heatsinks are left ungrounded i.e. floating and deionized water or other isolating fluids are used within the cooling systems of the heatsinks. These designs ensure that both, capacitively coupled voltages and fault voltages can be tolerated by the fluid. However, a problem arising with these designs is that the deionized water cooling systems are relatively expensive and require more maintenance effort.

SUMMARY

According to other designs known from prior art, the heatsinks may be solidly grounded and normal tap water, i.e. non-deionized water may be used as the cooling fluid. The grounding may protect the conductive fluid against harmful voltages, while the cooling systems is cheaper and easier to maintain than in the previous example. However, as a drawback, ground current may exceed the 30 A limit set by standard UL 347A during faults.

The aim of the present invention is to provide an improved heatsink arrangement and a power converter comprising a corresponding heatsink arrangement, which overcome the above-mentioned problems. This aim is achieved by the heatsink arrangement according to claim 1 and the power converter according to claim 7. Preferred embodiments of the invention are subject to the dependent claims.

According to the invention, a heatsink arrangement for power electronic equipment, such as a power converter, is provided. The heatsink arrangement comprises a heatsink, which may be a cold-plate. It may have a complex geometry, comprising cooling fluid conduits and/or cooling fins. The power electronic converter may be a medium voltage drive designed for driving an electric motor. The heatsink is grounded via a grounding capacitor.

As the capacitor protects the cooling fluid against capacitively coupled voltages, normal i.e. non-deionized water can be used as the cooling fluid. Hence, the fluid cooling systems may be provided at lower costs, while at the same time ground current during faults may be limited to less than 30 A by choosing an appropriate capacitance value of the grounding capacitor.

In a preferred embodiment of the invention, a resistor is provided in parallel to the grounding capacitor, further enhancing the performance of the device during normal operation and faults. There may be no other components in the parallel branches of the resistor and the capacitor other than said resistor and capacitor.

In another preferred embodiment of the invention, a voltage monitor measuring the voltage across the grounding capacitor is provided for detecting faults.

The voltage monitor may detect permanent fault conditions of the device, which may compromise the fluid cooling system if undetected. The voltage monitor may be used for monitoring the voltage across the grounding capacitor and comparing it with a threshold value. The voltage monitor may be used in combination with a control device and/or may be used for generating an alarm and/or a signal when a fault is detected. Alternatively or additionally, the voltage monitor may be used for tripping some safety device such as a circuit-breaker in case a fault has been detected. The voltage monitor may be arranged in parallel to the capacitor and/or in parallel to the resistor.

In a particularly preferable embodiment, the voltage across the grounding capacitor (2) is monitored and beyond a defined threshold, a signal is sent to a controller.

In another preferred embodiment of the invention, the current through the capacitor during faults is limited to less than 30 A. The skilled person may choose the capacitor's capacitance in dependence on the overall layout and the operating voltages of the drive so as to limit the fault current through the capacitor to the cited value.

In another preferred embodiment of the invention, the capacitor's capacitance is smaller than 19 μF and is preferably in the range of 0.1-10 μF.

The invention is also directed at a power converter in particular a medium voltage drive for driving an electric motor, comprising a heatsink arrangement according to any of claims 1 to 6, semiconductor switches mounted on the heatsink and a fluid cooling system. The term semiconductor switches may refer to a single switch or to any number of switches mounted on the heatsink. The switches may be mounted directly or indirectly on the heatsink. The drive may be operational for voltages greater than 1000V and in particular in a voltage range from 1 kV to 35 kV. The drive may be designed for operation at three or more phases and/or may include at least one medium voltage insulated-gate bipolar transistor.

In a preferred embodiment of the invention, the fluid of the fluid cooling system is non-deionized water. The cooling system may comprise fluid conduits, at least one pump and/or other components typically used for providing a cooling fluid flow in a power electronic converter. The non-deionized water may be normal i.e. tap water. Thus, the drive does not have stringent requirements with respect to its cooling fluid and its production and maintenance costs can be reduced accordingly.

In a further preferred embodiment of the invention, the semiconductor switches have limited electrical isolation towards the heatsink, which is bridged by a parasitic capacitance.

BRIEF DESCRIPTION OF THE DRAWINGS

Further features, details and advantages of the invention can be derived from the claim set and the figures described below. The figures show:

DETAILED DESCRIPTION

Figure 1:
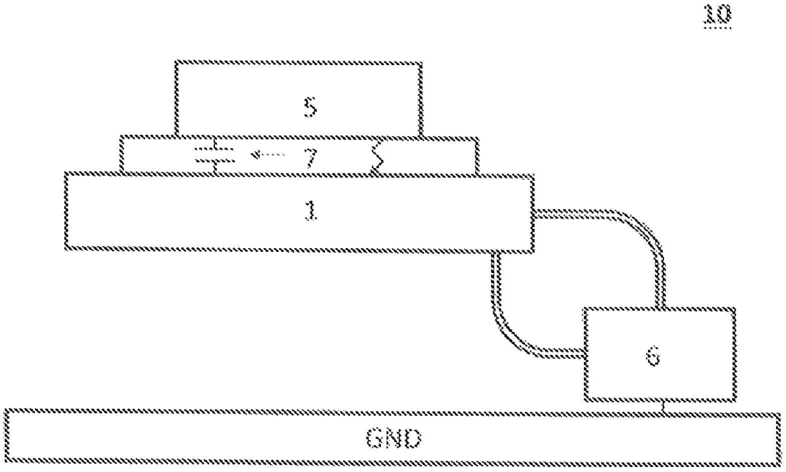
FIG. 1: schematic view of a floating heatsink arrangement in a medium voltage drive according to the state of the art.

FIG. 1 is a schematic view of a heatsink 1 in a medium voltage drive 10 according to the state of the art. The heatsink 1 is a "floating" heatsink 1 i.e. it is left ungrounded. Therefore, the fluid of the fluid cooling system 6 is chosen to be an isolating fluid such as deionized water. Grounding is indicated by GND in the figures and corresponds to an earthing.

Typically, semiconductor switches 5 are mounted on the heatsink 1 via an insulation layer comprising a parasitic capacitance 7. A fluid cooling system 6 cools the switches 5 through the heatsink 1. The use of deionized water as a cooling fluid raises the production and maintenance costs of the drive 10 and complicates its maintenance. For the sake of convenience, the same reference numbers refer to the same features throughout the figures.

Figure 2:
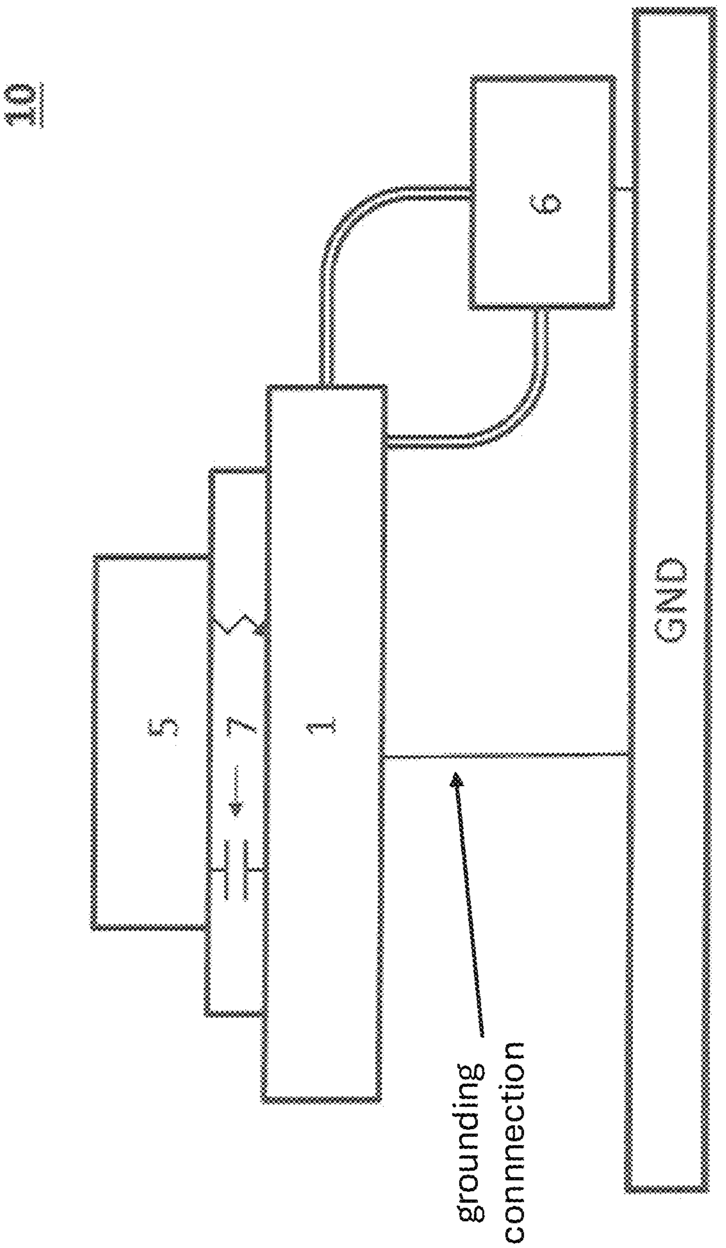
FIG. 2: schematic view of a solid grounded heatsink arrangement in a medium voltage drive according to the state of the art.

FIG. 2 is a schematic view of an alternative drive 10 layout, which is also known from the art. Here, the heatsink 1 is grounded. Normal tap water, i.e. non-deionized and therefore conductive water may be used as the cooling fluid instead of the deionized water used in the example of FIG. 1. The grounding may protect the conductive fluid against harmful voltages, while the cooling systems 6 is cheaper and easier to maintain than the cooling system of the previous example. However, as a drawback, ground current may exceed the 30 A limit set by standard UL 347A for medium voltage power conversion equipment during faults. In both embodiments of FIGS. 1 and 2 the switches 5 have limited electrical isolation towards the heatsink 1, wherein the isolation is bridged by a parasitic capacitance 7.

Figure 3:
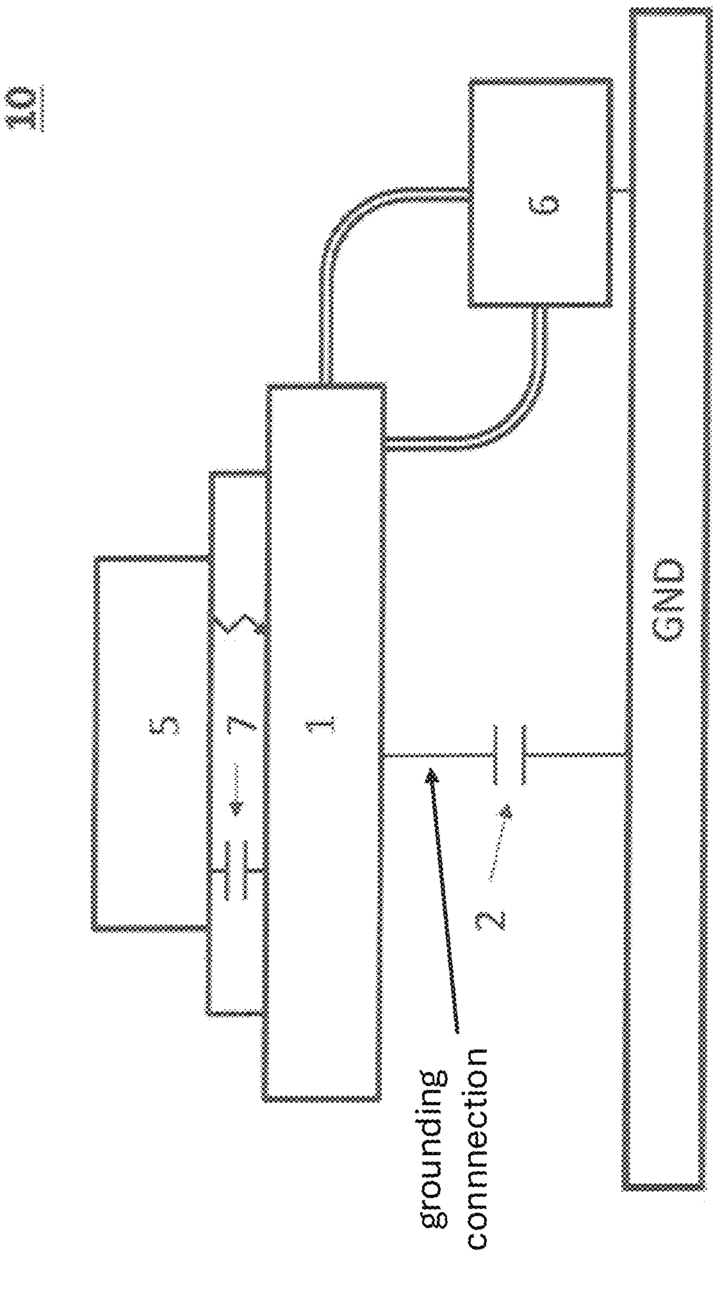
FIG. 3: schematic view of a heatsink arrangement in a medium voltage drive according to the present invention.

FIG. 3 is a schematic view of a heatsink 1 in a medium voltage drive 10. Both components are shown according to the present invention. The drive 10 may be a medium voltage drive 10 for driving an electric motor not shown in the figures. Here, the heatsink 1 is grounded via a grounding capacitor 2, connecting the heatsink 1 with ground GND. The capacitor 2 protects the fluid of the fluid cooling system 6 against capacitively coupled voltages. Therefore, grounding the heatsink 1 via a grounding capacitor 2 makes it possible to use simple tap water or generally non-deionized water or some other conductive fluid in the fluid cooling system 6. The invention provides a low-cost fluid cooling system and simplifies the operation and maintenance of the drive 10. At the same time, ground current during faults may be limited to less than 30 A by proper choice of capacitance value of the capacitor 2.

Figure 4:
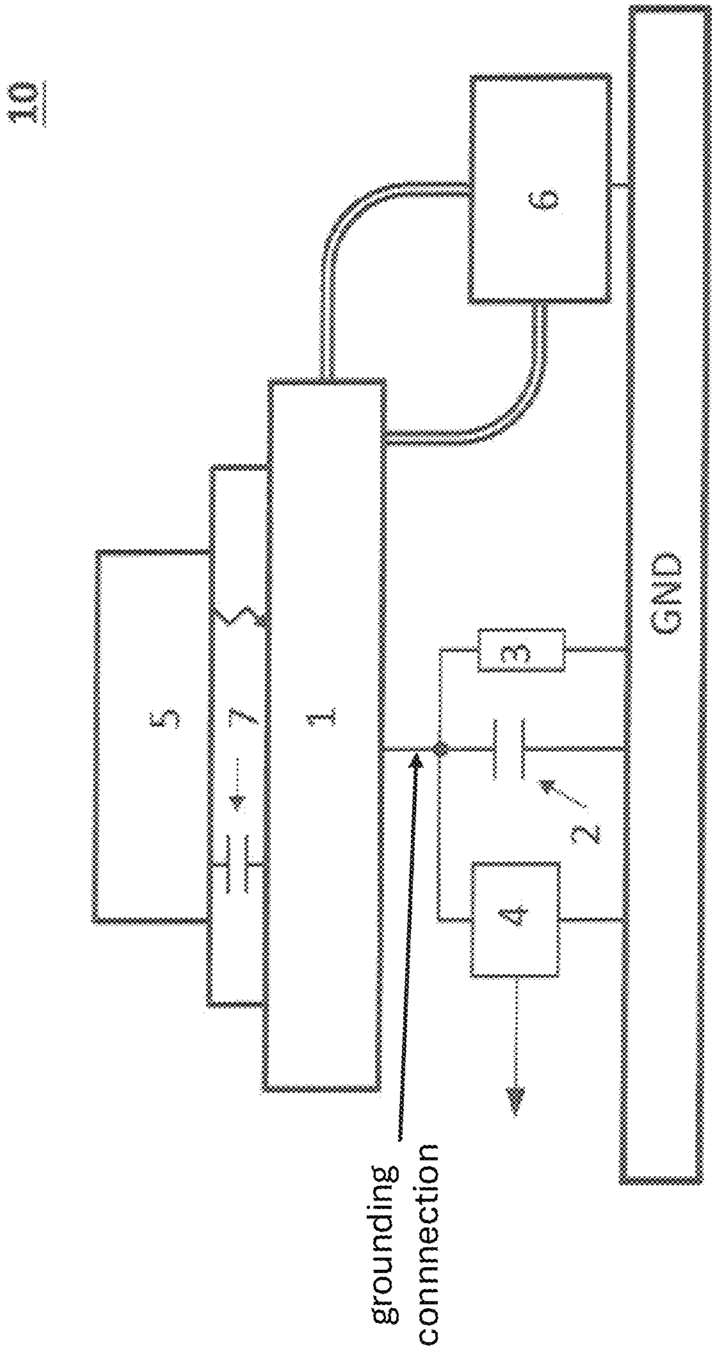
FIG. 4: schematic view of a heatsink arrangement in a medium voltage drive according to the present invention and including heatsink voltage monitor and a parallel resistor.

FIG. 4 shows an embodiment of the invention in which a resistor 3 is provided in parallel to the grounding capacitor 2, further enhancing the performance of the drive by providing a path for DC (leakage) currents from heatsink 1 to ground GND.

Additionally or alternatively, a voltage monitor 4 measuring the voltage across the grounding capacitor 2 may be provided for detecting faults. In the embodiment of FIG. 4, both, the voltage monitor 4 and the resistor 3 are shown. However, the invention may be carried out with either of these two components. Both, the voltage monitor 4 and the resistor 3 may be arranged in parallel to the capacitor 2. No other electrical components may be present in the parallel branches of the capacitor 2, the resistor 3 and/or the voltage monitor 4.

The voltage monitor 4 may be connected to some control device or controller not shown in the figure. The connection to the control device is indicated by the arrow left of the voltage monitor 4. In case the voltage monitor 4 detects a voltage, which is beyond some threshold value, the control device may output some corresponding signal to indicate the detected transgression. Thus, the voltage monitor 4 may be used to indicate that maintenance and/or replacement of the drive 10 or parts thereof are necessary. The signal of the voltage monitor 4 may also be used to trip a circuit breaker that is connected between the main power supply and the drive.

The characteristics of the capacitor 2 may be selected such that the current through the capacitor 2 during faults is limited to less than 30 A. As an example, when the supply voltage is 4.16 kV with 60 Hz, the capacitor's 2 capacitance may be derived such that it is smaller than the term 30 A/4.16 kV/(2×π×60 Hz)=19 μF. Preferably, the capacitor's 2 capacitance may be selected to be in the range of 0.1-10 μF.

Similarly, to what is known from the art, semiconductor switches 5 may be mounted on the heatsink 1 of the drive. Furthermore, the semiconductor switches 5 may have limited electrical isolation towards the heatsink 1, wherein the isolation is bridged by a parasitic capacitance 7. The capacitance of the isolation may be in the order of magnitude of 1 nF, i.e. orders of magnitude smaller than the chosen capacitance of capacitor 2.

The fluid cooling system 6 may comprise conduits, pumps and further components fluidly connected to the heatsink 1 and conductively connected to ground GND. The heatsink 1 may comprise conduits for the cooling fluid. The conduits of the heatsink 1 may be connected to the cooling system 6 or may be part of the cooling system 6. As the heatsink 1 is grounded via the capacitor 2, the fluid of the fluid cooling system 6 may be a conductive fluid such as non-deionized water.

The invention is not limited to any of the above embodiments. It may be modified in manifold ways. All features present in the claims, the description and the figures including constructive details, special configurations may be relevant to the invention on their own or in combination with each other.

The invention claimed is:

1. A heatsink arrangement for a power converter, the heat sink arrangement comprising a heatsink capacitively connected to earth ground via a capacitor, wherein the capacitor is directly electrically connected to the heatsink, wherein the capacitor is located between the heatsink and the earth ground, and wherein the capacitor is electrically connected between the heatsink and the earth ground.

2. The heatsink arrangement according to claim 1, further comprising a resistor provided in parallel to the capacitor, wherein the resistor is directly electrically connected to the heatsink.

3. The heatsink arrangement according to claim 1, wherein a voltage monitor measuring a voltage across the capacitor is provided for detecting faults.

4. The heatsink arrangement according to claim 3, characterized in that the voltage across the capacitor is monitored and beyond a defined threshold, a signal is sent to a controller.

5. The heatsink arrangement according to claim 1, wherein a capacitance of the capacitor is selected such that a current through the capacitor during faults is limited to less than 30 A.

6. The heatsink arrangement according to claim 1, wherein the capacitor's capacitance is smaller than 19 μF and is preferably in the range of 0.1-10 μF.

7. A power converter for driving an electric motor, the power converter comprising a heatsink arrangement comprising a heatsink capacitively connected to earth ground via a capacitor, semiconductor switches mounted on the heatsink and a fluid cooling system, wherein the capacitor is directly electrically connected to the heatsink, wherein the capacitor is located between the heatsink and the earth ground, and wherein the capacitor is electrically connected between the heatsink and the earth ground.

8. The power converter according to claim 7, wherein a fluid of the fluid cooling system is non-deionized water.

9. A power converter for driving an electric motor, comprising a heatsink arrangement for the power converter, semiconductor switches mounted on a heatsink, and a fluid cooling system, wherein the heatsink is capacitively connected to earth ground via a capacitor, and wherein an insulation layer provided between the semiconductor switches and the heatsink comprises a parasitic capacitance, wherein the capacitor is directly electrically connected to the heatsink, wherein the capacitor is located between the heatsink and the earth ground, and wherein the capacitor is electrically connected between the heatsink and the earth ground.

10. The heatsink arrangement according to claim 2, wherein a voltage monitor measuring the voltage across the capacitor is provided for detecting faults.

11. The heatsink arrangement according to claim 2, wherein a capacitance of the capacitor is selected such that a current through the capacitor during faults is limited to less than 30 A.

12. The heatsink arrangement according to claim 3, wherein a capacitance of the capacitor is selected such that a current through the capacitor during faults is limited to less than 30 A.

13. The heatsink arrangement according to claim 4, wherein a capacitance of the capacitor is selected such that a current through the capacitor during faults is limited to less than 30 A.

14. The heatsink arrangement according to claim 2, wherein the capacitor's capacitance is smaller than 19 μF and is preferably in the range of 0.1-10 μF.

15. The heatsink arrangement according to claim 3, wherein the capacitor's capacitance is smaller than 19 μF and is preferably in the range of 0.1-10 μF.

16. The heatsink arrangement according to claim 4, wherein the capacitor's capacitance is smaller than 19 μF and is preferably in the range of 0.1-10 μF.

17. The heatsink arrangement according to claim 5, wherein the capacitor's capacitance is smaller than 19 μF and is preferably in the range of 0.1-10 μF.

* * * * *